United States Patent
Taniguchi et al.

(10) Patent No.: US 8,164,398 B2
(45) Date of Patent: Apr. 24, 2012

(54) RESONATOR, FILTER AND ELECTRONIC DEVICE

(75) Inventors: Shinji Taniguchi, Kawasaki (JP); Tokihiro Nishihara, Kawasaki (JP); Masufumi Iwaki, Kawasaki (JP); Masanori Ueda, Kawasaki (JP); Go Endo, Yokohama (JP); Tsuyoshi Yokoyama, Kawasaki (JP); Takeshi Sakashita, Kawasaki (JP); Motoaki Hara, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 394 days.

(21) Appl. No.: 12/547,235

(22) Filed: Aug. 25, 2009

(65) Prior Publication Data

US 2010/0117762 A1   May 13, 2010

(30) Foreign Application Priority Data

Nov. 13, 2008   (JP) .................................. 2008-291417

(51) Int. Cl.
*H03H 9/15* (2006.01)
*H03H 9/54* (2006.01)
*H03H 9/70* (2006.01)

(52) U.S. Cl. ........ 333/133; 333/187; 333/189; 310/312; 310/364

(58) Field of Classification Search .......... 333/187–189, 333/133; 310/364, 312
See application file for complete search history.

(56) References Cited

U.S. PATENT DOCUMENTS

| 6,291,931 | B1 | 9/2001 | Lakin |
| 6,933,807 | B2* | 8/2005 | Marksteiner et al. ......... 333/187 |
| 7,482,737 | B2* | 1/2009 | Yamada et al. ............... 310/363 |
| 7,579,761 | B2* | 8/2009 | Nishihara et al. ............ 310/364 |
| 7,768,364 | B2* | 8/2010 | Hart et al. ..................... 333/187 |
| 2004/0046622 | A1* | 3/2004 | Aigner et al. ................. 333/187 |
| 2004/0140868 | A1* | 7/2004 | Takeuchi et al. .............. 333/189 |
| 2005/0073375 | A1* | 4/2005 | Sul et al. ....................... 333/133 |
| 2005/0264137 | A1* | 12/2005 | Taniguchi et al. ............. 310/324 |
| 2006/0255693 | A1* | 11/2006 | Nishihara et al. ............. 310/365 |
| 2007/0252662 | A1* | 11/2007 | Nishihara et al. ............. 333/133 |
| 2009/0302973 | A1* | 12/2009 | Hart et al. ..................... 333/187 |

FOREIGN PATENT DOCUMENTS

JP   2005-136467   *   5/2005

OTHER PUBLICATIONS

H.P. Lobl et al., "Piezoelectric Materials for BAW Resonators and Filters", 2001 IEEE Ultrasonics Symposium, pp. 807-pp. 811.

* cited by examiner

*Primary Examiner* — Barbara Summons
(74) *Attorney, Agent, or Firm* — Chen Yoshimura LLP

(57) ABSTRACT

A resonator includes a substrate, a lower electrode, a piezoelectric film provided on the lower electrode, and an upper electrode provided on the piezoelectric film. The lower electrode includes a first film provided on the substrate, and a second film that is provided on the first film and has a specific gravity greater than that of the first film. The piezoelectric film is provided on the second film. The upper electrode includes a third film provided on the piezoelectric film, and a fourth film provided on the third film, the third film having a specific gravity greater than that of the fourth film. The third film is thicker than the second film.

12 Claims, 12 Drawing Sheets

RESONATOR, FILTER AND ELECTRONIC DEVICE

CROSS-REFERENCE TO RELATED APPLICATION

This application is based upon and claims the benefit of priority of the prior Japanese Patent Application No. 2008-291417, filed on Nov. 13, 2008, the entire contents of which are incorporated herein by reference.

FIELD

A certain aspect of the embodiments discussed herein is related to a resonator, a filter, a duplexer and an electronic device.

BACKGROUND

Wireless communication devices, which may typically be portable phones, have become widely used and there has been an increasing demand for miniaturized and lightweight resonators and filters using such resonators. Conventionally, a dielectric filter and a surface acoustic wave filter (SAW filter) are generally used. Recently, a piezoelectric thin-film resonator and a filer using such a resonator have been widely noticed because the piezoelectric thin-film resonator may be downsized and implemented monolithically.

SUMMARY

According to an aspect of the present invention, there is provided a resonator including: a substrate; a lower electrode; a piezoelectric film provided on the lower electrode; and an upper electrode provided on the piezoelectric film, the lower electrode including a first film provided on the substrate, and a second film that is provided on the first film and has a specific gravity greater than that of the first film, the piezoelectric film being provided on the second film, the upper electrode including a third film provided on the piezoelectric film, and a fourth film provided on the third film, the third film having a specific gravity greater than that of the fourth film, and the third film being thicker than the second film.

DESCRIPTION OF EMBODIMENTS

Figure 1:
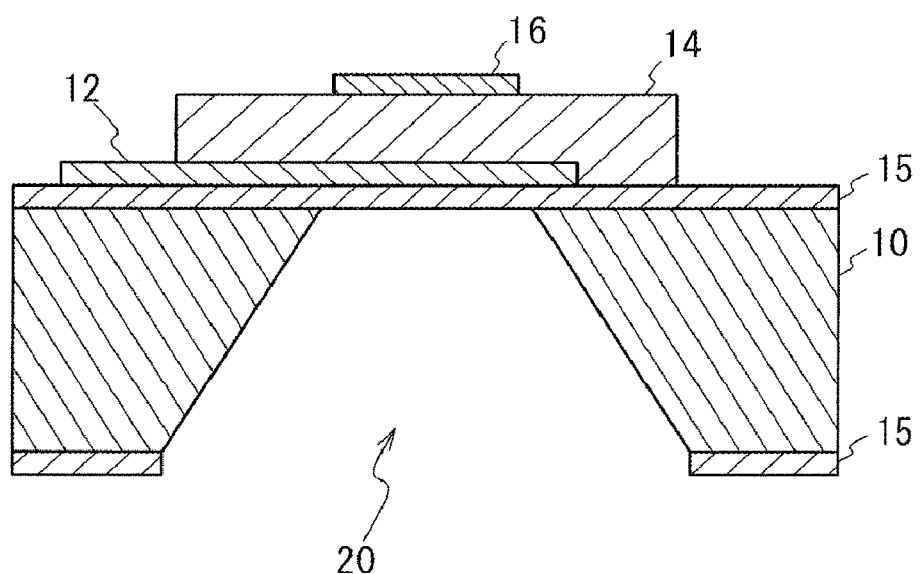
FIG. 1 is a cross-sectional view of a piezoelectric thin-film resonator.
Figure 2:
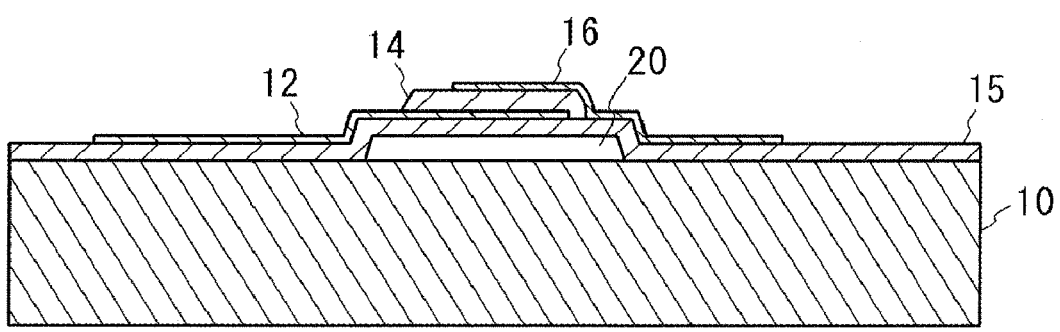
FIG. 2 is a cross-sectional view of another piezoelectric thin-film resonator.
Figure 3:
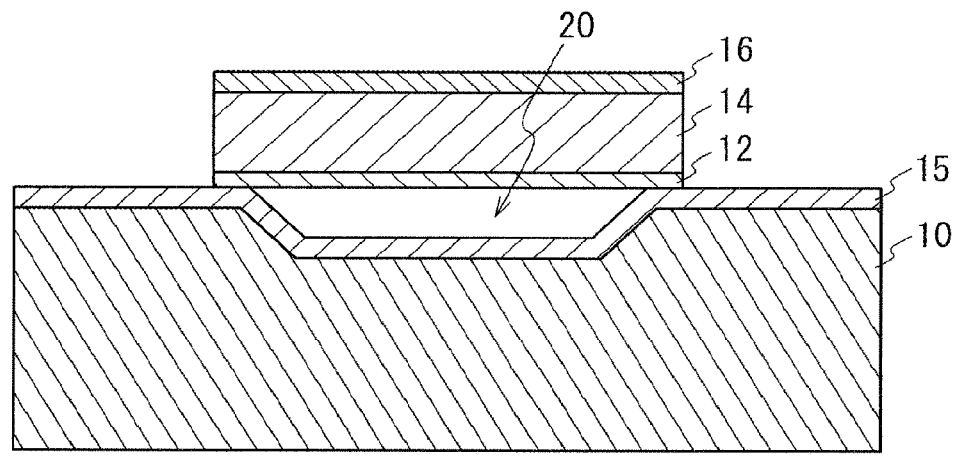
FIG. 3 is a cross-sectional view of yet another piezoelectric thin-film resonator.
Figure 4:
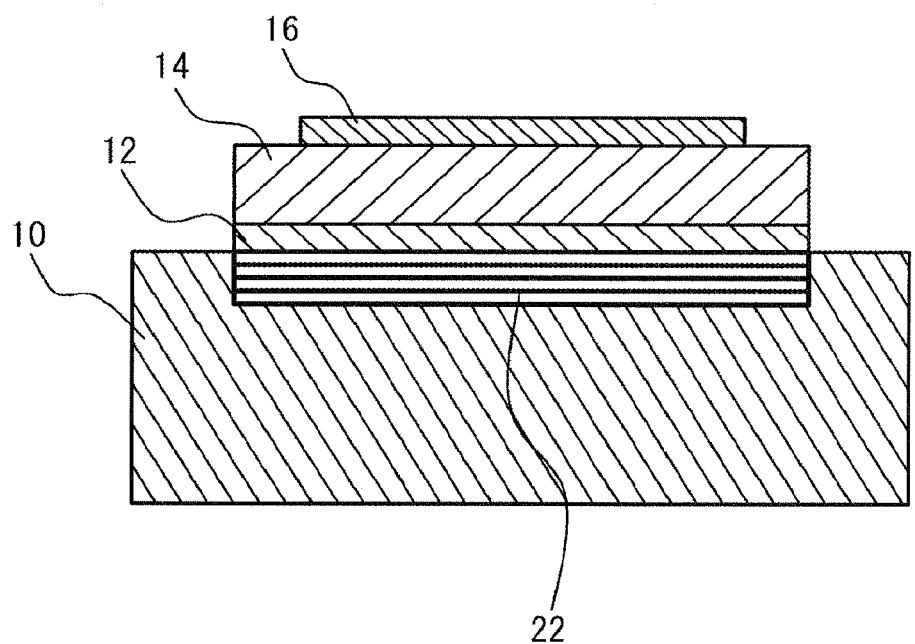
FIG. 4 is a cross-sectional view of a further piezoelectric thin-film resonator.

The piezoelectric thin-film resonator includes an FBAR type and an SMR type where FBAR is an abbreviation of Film-Bulk Acoustic Resonator and SMR is an abbreviation of Solidly Mounted Resonator. Referring to FIGS. 1 through 3, an FBAR has a multilayer or stacked film structure including a substrate 10, a lower electrode 12, a piezoelectric film 14, an upper electrode 16. An opening or a cavity 20 is formed that is located below the lower electrode 12 in a region in which the lower electrode 12 and the upper electrode 16 are opposite to each other across the piezoelectric film 14. A resonator composed of the lower electrode 12, the piezoelectric film 14 and the upper electrode 16 is formed in the region. An insulator film 15 is formed below the lower electrode 12 or the substrate 10. In the structure illustrated in FIG. 1, the opening is formed in the substrate 10 by wet or dry etching from the backside of the substrate 10. In the structure illustrated in FIG. 2, the cavity 20 is formed by removing a sacrificed layer formed on the surface of the substrate 10 by wet etching, so that the cavity 20 can be defined between the lower electrode 12 and the substrate 10. In the structure illustrated in FIG. 3, the cavity 20 is formed in a dent on the substrate 10. As illustrated in FIG. 4, in the SMR, an acoustic multilayer film 22 is employed instead of the opening or cavity. The acoustic multilayer film 22 may be formed by alternately stacking a first layer having a comparatively high acoustic impedance and a second layer having a comparatively low acoustic impedance, each of which layers is λ/4 thick where λ is the wavelength of the acoustic wave propagated through the acoustic multilayer film 22.

The piezoelectric thin-film resonator operates as follows in which the FBAR is taken as an example. When a voltage of a high frequency or RF signal is applied between the upper electrode and the lower electrode, an acoustic wave is excited due to the piezoelectric converse effect caused within the piezoelectric film in the resonator region. A deformation of the piezoelectric film caused by the acoustic wave is converted into an electric signal developed between the upper electrode and the lower electrode due to the piezoelectric effect. The acoustic wave is totally reflected by interfaces at which the upper and lower electrodes (which may include additional films provided thereon) face with air. Thus, longitudinal vibration having primary displacement in the thickness direction of the piezoelectric film is caused. The resonance effect resulting from the longitudinal vibration may be applied to a resonator or filter having a desired frequency characteristic.

The resonance effect takes place at a frequency at which the total thickness H of the multilayer structure composed of the lower electrode, the piezoelectric film and the upper electrode (which may include films additionally provided on the upper and lower electrodes) is an integral multiple (n times) of ½ of the wavelength λ of the acoustic wave (H=nλ/2). Assuming that V is the velocity at which the acoustic wave is propagated through the piezoelectric film, the resonance frequency F is written as F=nV/(2H). It can be seen from the above that the resonance frequency F can be controlled by the total thickness H of the stacked layers.

The upper and lower electrodes may be made of aluminum (Al), copper (Cu), molybdenum (Mo), tungsten (W), tantalum (Ta), platinum (Pt), ruthenium (Ru), rhodium (Rh), iridium (Ir), chromium (Cr), or titanium (Ti) or any combination thereof The piezoelectric film may be made of, for example, aluminum nitride (AlN), zinc oxide (ZnO), lead zirconate titanate (PZT), or lead titanate ($PbTiO_3$). The substrate 10 may be made of, for example, silicon or glass.

The piezoelectric thin-film resonator is required to have an increased electromechanical coupling coefficient (k2) and the Q factor. It is thus possible to broaden the pass band of the filter characteristic. The electromechanical coupling coefficient may be improved by first through third ways described below.

The first way is to select a piezoelectric film having a large electromechanical coupling coefficient. It is known that PZT and $PbTiO_3$ have greater electromechanical coupling coefficients than those of AlN and ZnO.

The second way is to improve the orientation of the piezoelectric film to improve the electromechanical coupling coefficient. This is described, for example, IEEE Ultrasonics Symposium, pp 807-pp 811, 2001.

The third way is to control the ratio between the sum of the thickness of the lower electrode and that of the upper electrode and the thickness of the piezoelectric film to improve the electromechanical coupling coefficient. U.S. Pat. No. 6,291,931 discloses the relation between the sum of the thickness of the upper electrode and that of the lower electrode and the thickness of the piezoelectric film for cases where the upper and lower electrodes are made of respective metals of tungsten, aluminum, gold or copper.

However, the first way has a problem that it is difficult to reliably grow high-quality films of lead zirconate titanate or lead titanate and practicable resonance performance of the piezoelectric-thin film resonator using these materials has not yet been realized. The second way requires various controls such as selection of the material underlying the piezoelectric film, the surface roughness of the underlying material, and the conditions for growing the piezoelectric film. If the controls are insufficient, there may be an error in the orientation of the piezoelectric film. Such an error in the orientation may affect the resonance performance. The third way reduces the ratio between the sum of the thickness of the lower electrode and that of the upper electrode and the thickness of the piezoelectric film in order to improve the electromechanical coupling coefficient. However, the reduction in the sum of the thickness of the lower electrode and that of the upper electrode inevitably increases the resistance of the electrodes, and thus increases the insertion loss. Thus, it is eventually difficult to improve the electromechanical coupling coefficient of the piezoelectric thin-film resonator by the third way.

A certain aspect of embodiments described below is related to improvements in the electromechanical coupling coefficient.

A description will now be given of embodiments of the present invention with reference to the accompanying drawings.

First Embodiment

Figure 5:
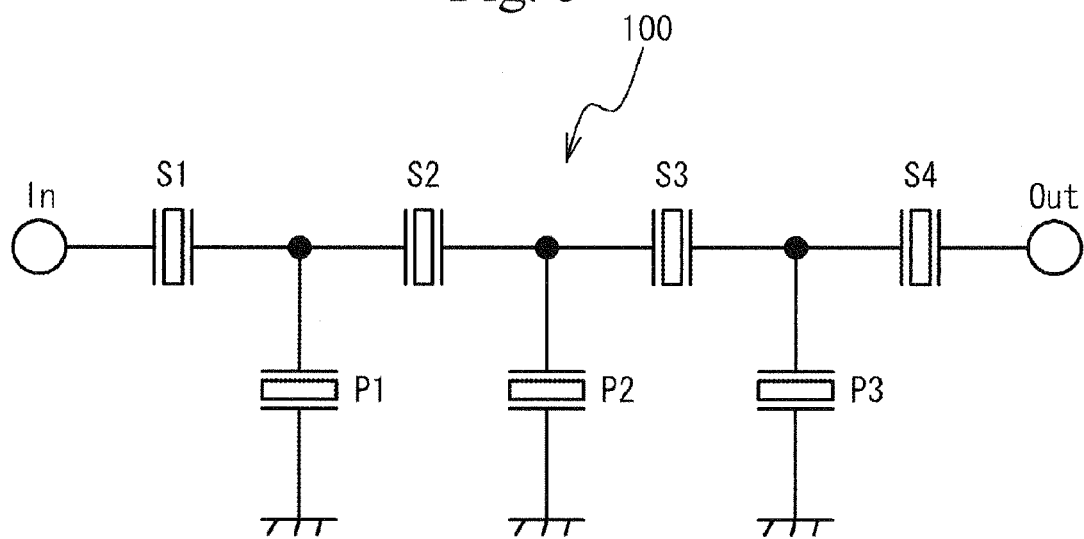
FIG. 5 is a circuit diagram of a ladder type filter in accordance with a first embodiment.

FIG. 5 is a circuit diagram of a ladder type filter 100 equipped with piezoelectric thin-film resonators in accordance with a first embodiment. The ladder type filter 100 has series-arm resonators S1 through S4 connected in series between an input terminal In and an output terminal Out. There are parallel-arm resonators P1 through P3 connected between nodes between the adjacent series-arm resonators and ground. The resonance frequencies of the parallel-arm resonators P1 through P3 are lower than those of the series-arm resonators S1 through S4. This setting causes the ladder type filter 100 to function as a band-pass filter.

Figure 6:
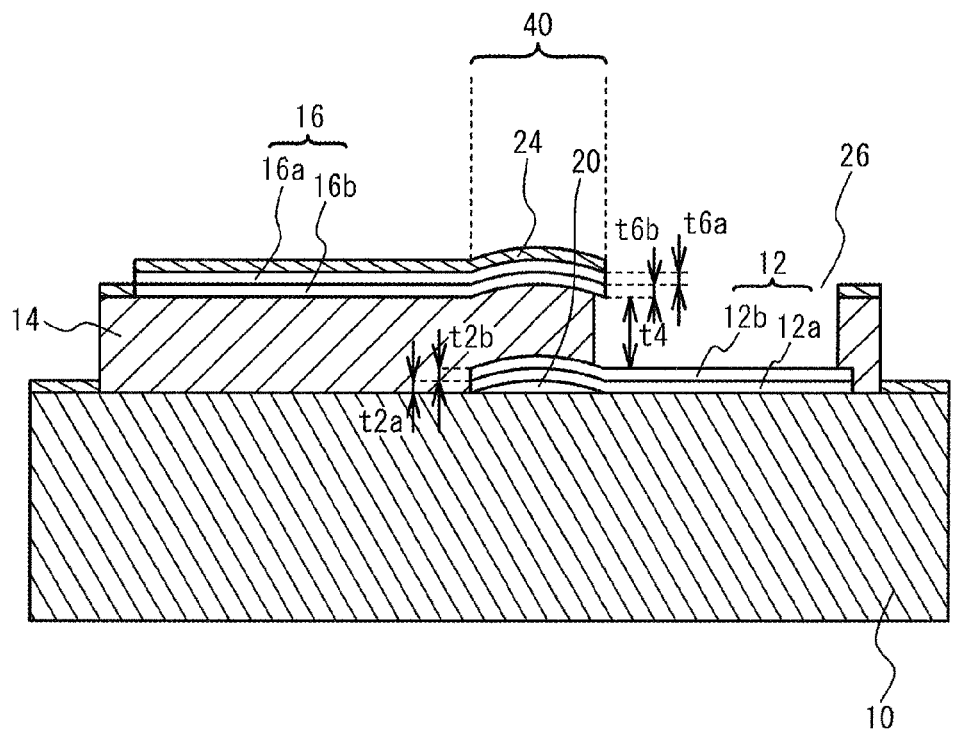
FIG. 6 is a cross-sectional view of a series-arm resonator employed in the first embodiment.

FIG. 6 is a cross-sectional view of a piezoelectric thin-film resonator that corresponds to any of the series-arm resonators S1 through S4 of the ladder type resonator 100. Referring to FIG. 6, the lower electrode 12 is formed on the substrate 10, which has a flat main surface and is made of silicon. The lower electrode 12 has a double-layer structure composed of a low specific gravity lower electrode 12a and a high specific gravity lower electrode 12b. The low specific gravity lower electrode 12a is formed on the substrate 10 and mainly includes Cr. The high specific gravity lower electrode 12b is provided on the low specific gravity lower electrode 12a and is made of Ru. The piezoelectric film 14, which has a main axis in the (002) direction and mainly includes AlN, is formed on the high specific gravity lower electrode 12b. The upper electrode 16 is formed on the piezoelectric film 14. The upper electrode 16 has a double-layer structure composed of a high specific gravity electrode 16b and a low specific gravity upper electrode 16a. The high specific gravity upper electrode 16b is formed on the piezoelectric film 14 and mainly includes Ru. The low specific gravity upper electrode 16a is formed on the high specific gravity upper film 16b and mainly includes Cr. The upper electrode 16 is provided so as to have a region that faces the lower electrode 12 across the piezoelectric film 14. In the above region, a resonance section 40 is formed. A first adjustment film 24, which mainly includes $SiO_2$ and may be an insulative film, is provided on the upper electrode 16. The first adjustment film 24 is used to adjust the resonance frequency of the resonator and protects the resonator section 40. The lower electrode 12 is formed on the substrate 10 so that a cavity 20 formed into a dome shape having an upward convexity is defined between the substrate 10 and the lower electrode 12. The cavity 20 formed into a dome shape having an upward convexity increases the height towards the center from the periphery.

As illustrated in FIG. 6, the piezoelectric film 14 contacts the lower electrode 12b having a greater specific gravity than that of the lower electrode 12a and contacts the upper electrode 16b having a greater specific gravity than that of the upper electrode 16a. Now, the following thickness is defined:

t4: the thickness of the piezoelectric film 14;

t2a: the thickness of the low specific gravity lower electrode 12a;

t2b: the thickness of the high specific gravity lower electrode 12b;

t6a: the thickness of the low specific gravity upper electrode 16a; and t6b: the thickness of the high specific gravity upper electrode 16b.

In accordance with the first embodiment, t2b<t6b.

Figure 7:
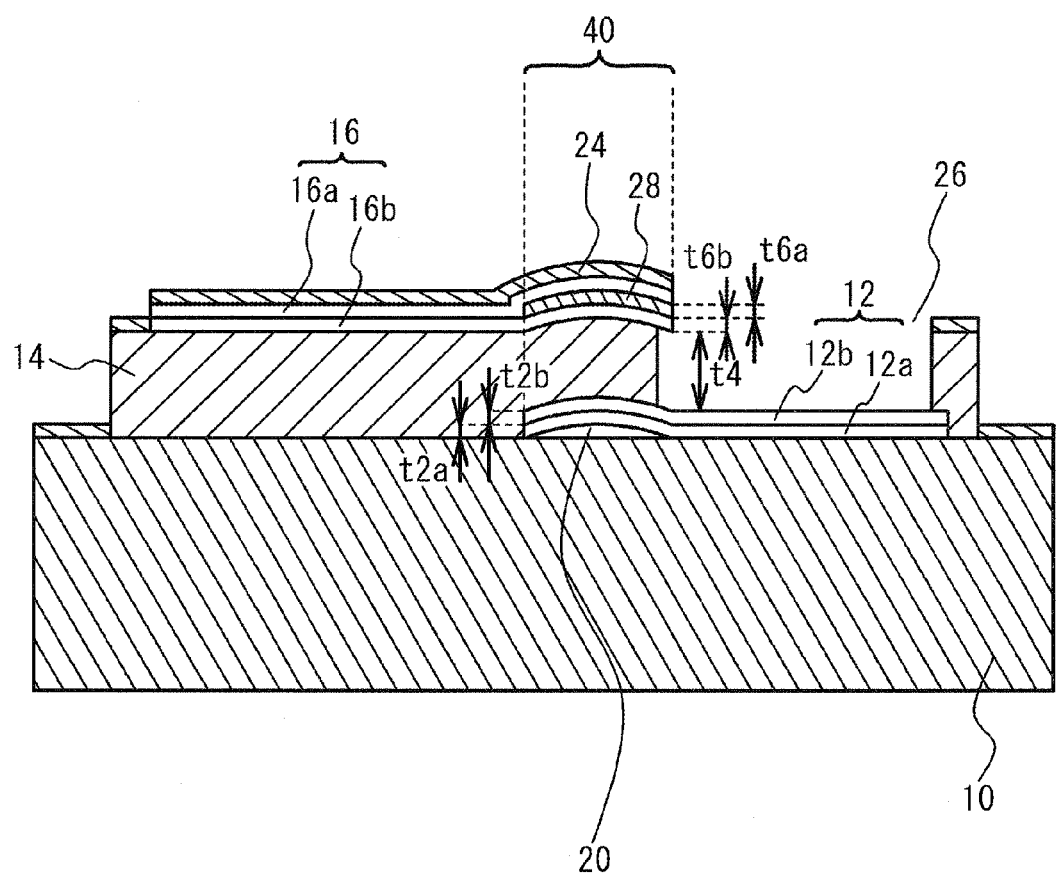
FIG. 7 is a cross-sectional view of a parallel-arm resonator employed in the first embodiment.

FIG. 7 is a cross-sectional view of a piezoelectric thin-film resonator that corresponds to any of the parallel-arm resonators of the ladder type filter 100. The series-arm resonator illustrated in FIG. 6 is configured so that the low specific gravity upper electrode 16a and the high specific gravity upper electrode 16b directly contact each other, while the parallel-arm resonator illustrated in FIG. 7 is configured so that a second adjustment film 28 including Ti mainly is interposed between the low specific gravity upper electrode 16a and the high specific gravity upper electrode 16b. It is possible to adjust the resonance frequencies of both the series-arm resonators and the parallel-arm resonators by adjusting the first adjustment film 24 in the manufacturing process. Further, by adjusting the second adjustment film 28 in the manufacturing process, it is possible to adjust the resonance frequencies of only the parallel-arm resonators. The use of the first adjustment film 24 and the second adjustment film 28 makes it possible to easily realize the desired filter characteristic.

Figure 8A:
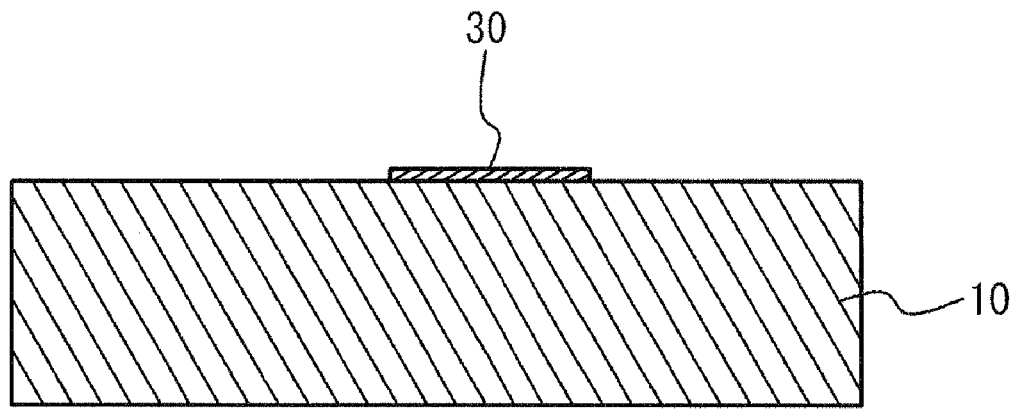
FIGS. 8A through 8C are cross-sectional views illustrating a process for manufacturing the resonator of the first embodiment.
Figure 8B:
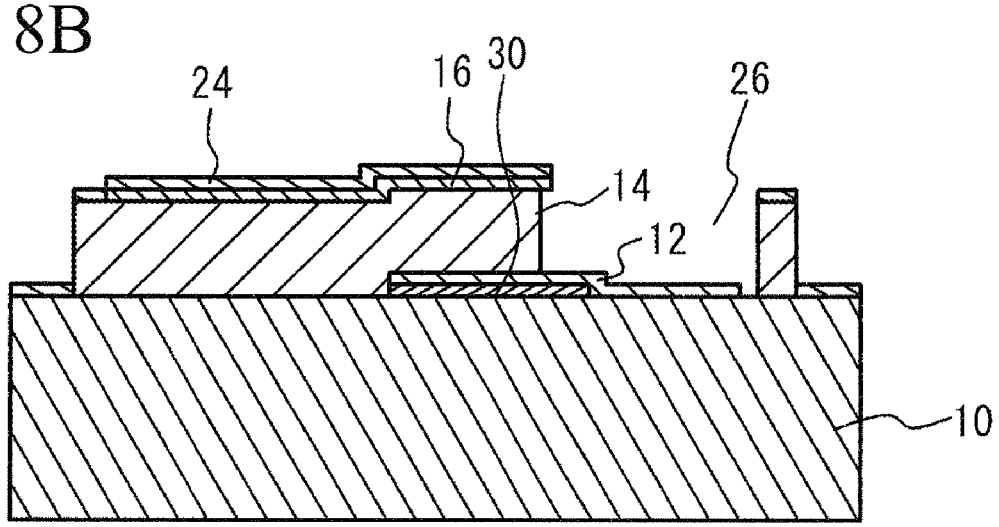
Figure 8C:
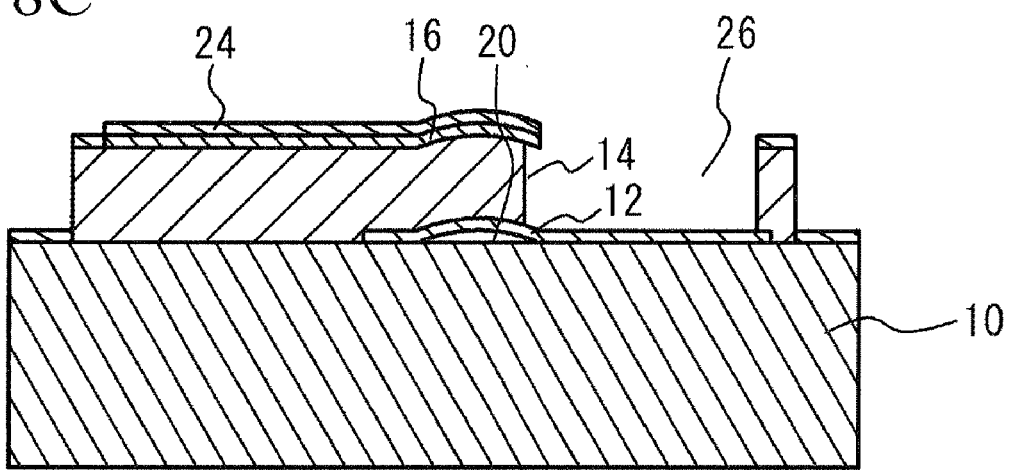

FIGS. 8A through 8C are cross-sectional views illustrating a method for manufacturing the series-arm resonators. Referring to FIG. 8A, a sacrificed layer 30, which may be made of magnesium oxide (MgO) and may be 20-100 nm thick, is formed on the substrate 10 by sputtering or vacuum evaporation. Instead of MgO, the first embodiment may employ a material that is easily melted by etching, such as ZnO, Ge, Ti, or $SiO_2$. The sacrificed layer 30 is formed into a predetermined shape by the photolithography technique and the etching technique. The area of the sacrificed layer 30 may be slightly greater than the area of the resonance section 40. Thus, the dome shape may easily be defined at the step of FIG. 8C.

Referring to FIG. 8B, a Cr film (low specific gravity lower electrode) and a Ru film (high specific gravity lower electrode) used to form the lower electrode 12 are formed in an atmosphere of Ar gas at a pressure of 0.6-1.2 Pa so as to cover the sacrificed layer 30 by sputtering. The Cr film and the Ru film are continuously grown. By using the photolithography technique and the etching technique, the lower electrode 12 is formed into a predetermined shape. Then, AlN used to form the piezoelectric film 14 is formed on the lower electrode 12 and the substrate 10 in an atmosphere of $Ar/N_2$ gas at a pressure of about 0.3 Pa by sputtering. Thereafter, a Ru film (high specific gravity upper electrode) and a Ti film (second adjustment film) are formed on the piezoelectric film 14 in an atmosphere of Ar gas at a pressure of 0.6-1.2 Pa by sputtering. The Ti film remains in the resonance section 40 of the parallel-arm resonator, and the Ti film of the series-arm resonators is removed. A Cr film (low specific gravity upper electrode) is formed in an atmosphere of Ar gas at a pressure of 0.6-1.2 Pa by sputtering. Then, the first adjustment film 24 is formed on the upper electrode 16. By using the photolithography technique and the etching technique, the first adjustment film 24, the upper electrode 16 and the piezoelectric film 14 are formed into a predetermined shape. It is thus possible to define the resonance section composed of the lower electrode 12, the piezoelectric film 14 and the upper electrode 16. An opening 26 is formed in the piezoelectric film 14 in order to make an electric connection with the lower electrode 12.

Referring to FIG. 8C, etchant for etching the sacrificed layer 30 is applied through a guide path (not illustrated) and the sacrificed layer 30 is removed. Stress of the multilayer structure composed of the lower electrode 12, the piezoelectric film 14 and the upper electrode 16 are set compressive by appropriately adjusting the conditions for sputtering. Thus, when the removal of the sacrificed layer 30 by etching is completed, the composite film composed of the lower electrode 12, the piezoelectric film 14 and the upper electrode 16 rises so as to define the dome-shaped cavity 20. The compressive stress of the composite film may be set equal to −150 MPa to −300 MPa in the first embodiment.

Figure 9A:
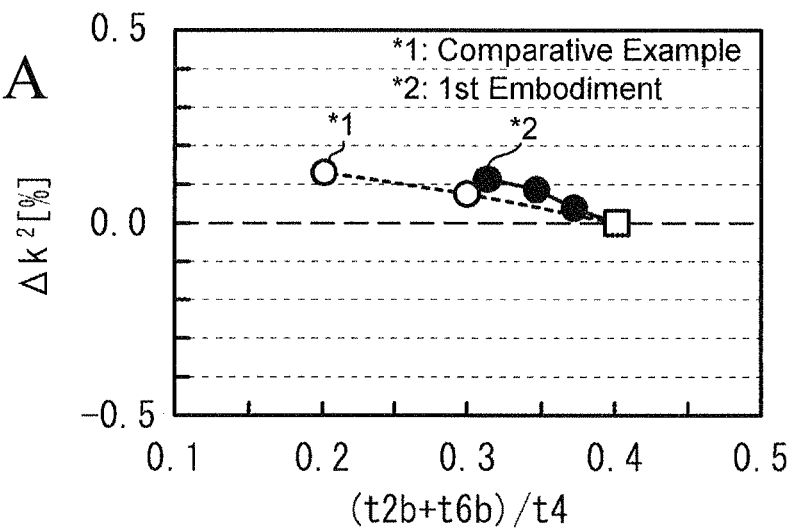
FIG. 9A illustrates the difference ($\Delta k^2$) in the electromechanical coupling coefficient between a reference resonator and sample resonators with regard to the film thickness ratio.
Figure 9B:
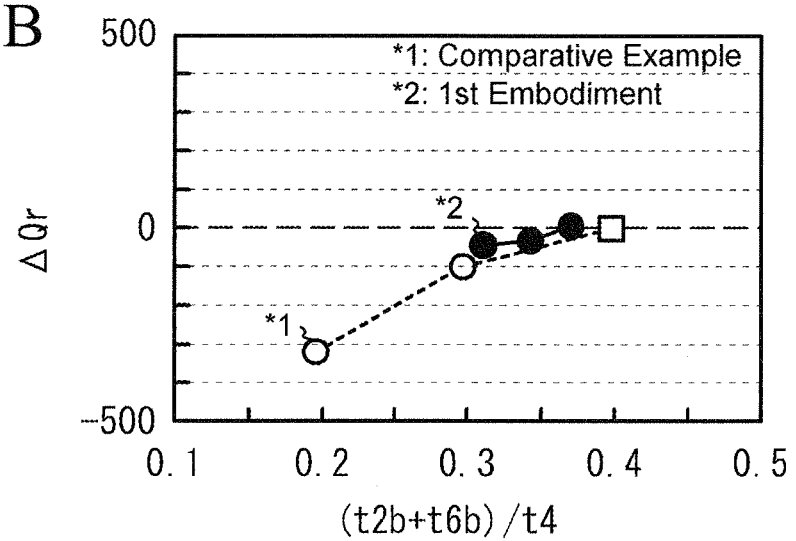
FIG. 9B illustrates the difference ($\Delta Qr$) in the Q factor of the resonance point between the reference resonator and the sample resonators with regard to the film thickness ratio.
Figure 9C:
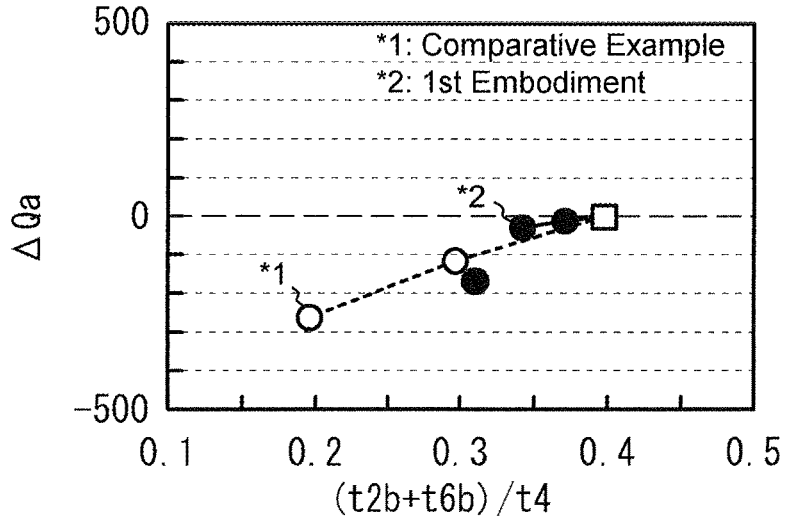
FIG. 9C illustrates the difference ($\Delta Qa$) in the Q factor of the anti-resonance point between the reference resonator and the sample resonators with regard to the film thickness ratio.

A description will now be given of the relations between the ratio of the total thickness of the high specific gravity films and the piezoelectric film (film thickness ratio) and the resonance characteristics in some sample resonators. FIGS. 9A through 9C relate to characteristics of the sample resonators. More particularly, FIG. 9A illustrates the difference ($\Delta k^2$) in the electromechanical coupling coefficient between a reference resonator and sample resonators with regard to the film thickness ratio. FIG. 9B illustrates the difference ($\Delta Qr$) in the Q factor of the resonance point between the reference resonator and the sample resonators with regard to the film thickness ratio. FIG. 9C illustrates the difference ($\Delta Qa$) in the Q factor of the anti-resonance point between the reference resonator and the sample resonators with regard to the film thickness ratio. In FIG. 6, the total thickness of the high specific gravity electrodes is equal to t2b and t6b, and the thickness of the piezoelectric film 14 is t4. Thus, the film thickness ratio is (t2b+t6b)/t4. The reference resonator is configured so that the piezoelectric film 14 is 1190 nm thick, and the high specific gravity lower electrode 12b and the high specific gravity upper electrode 16b are 240 nm thick. The film thickness ratio of the reference resonator is 0.4. The reference resonator is indicated by a blank square in FIGS. 9A through 9C.

A first comparative example is designed so that the film thickness ratio is reduced from 0.4 by equally reducing the thickness of the high specific gravity lower electrode 12b and that of the high specific gravity upper electrode 16b by an increase in the thickness of the piezoelectric film 14 so as to keep the resonance frequency constant. In the first comparative example, such a relation that t2b=t6b is maintained. The first embodiment has the following specification. The film thickness t6b of the high specific gravity upper electrode 16 is 240 nm. Further, the film thickness ratio is reduced by reducing the film thickness of the high specific gravity lower electrode 12b by an increased thickness of the piezoelectric film so as to keep the resonance frequency constant. The thickness of the low specific gravity lower electrode 12a and that of the low specific gravity upper electrode 16a are selected so as to satisfy t2a+t6a=130 nm the lower electrodes 12 and the upper electrode 16 have a substantially equal mass. The resonance section 40 has an ellipse of 247×177 μm. In FIGS. 9A through 9C, the first embodiment is indicated by a solid circle, and the first comparative example is indicated by a blank circle.

Referring to FIG. 9A, as the film thickness ratio decreases, the electromechanical coupling coefficient increases. This phenomenon coincides with the contents of U.S. Pat. No. 6,291,931 described previously. As illustrated in FIGS. 9B and 9C, as the film thickness ratio decreases, the Q factor decreases. This is because a reduced film thickness ratio increases the resistance of the electrodes. It can be said that there is a trade-off relation between the electromechanical coupling coefficient and the Q factor. As illustrated in FIG. 9A, for the same film thickness ratio, the first embodiment has a greater electromechanical coupling coefficient than that of the first comparative example. As illustrated in FIGS. 9B and 9C, for the same film thickness ratio, the first embodiment has a greater Q factor than that of the first comparative example. By meeting t2b<t6b, the electromechanical coupling coefficient can be improved for the same Q factor.

In order to excite the acoustic wave symmetrically on the top and bottom of the piezoelectric film 14, it is required that the lower electrode 12 and the upper electrode 16 have a substantially equal mass. In case where the acoustic wave is not excited symmetrically on the top and bottom of the piezoelectric film 14, the resonance characteristic may be degraded.

Taking the above into consideration, the thickness t2b of the high specific gravity lower electrode 12b and the thickness t6b of the high specific gravity upper electrode 16b are selected so that t2b<t6b. The electromechanical coupling coefficient and the Q factor are primarily influenced by the electrodes 12b and 16b that contact the piezoelectric film 14. The above setting of the film thickness improves the electromechanical coupling coefficient and the Q factor. The excitation of the acoustic wave in the piezoelectric film 14 is mainly determined by the masses of the lower electrode 12 and the upper electrode 16. Thus, the lower electrode 12 and the upper electrodes 16 are designed to have almost equal masses. It is thus possible to excite the acoustic wave symmetrically in the piezoelectric film 14 and improve the characteristics of the resonator.

Figure 10A:
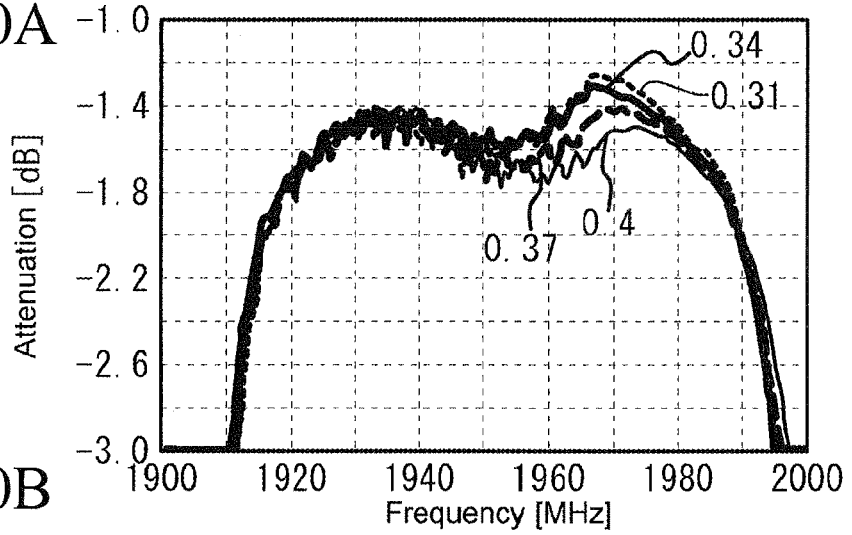
FIG. 10A illustrates pass bands of a filter equipped with the reference resonators and a filter equipped with resonators having different film thickness ratios defined by the first embodiment.
Figure 10B:
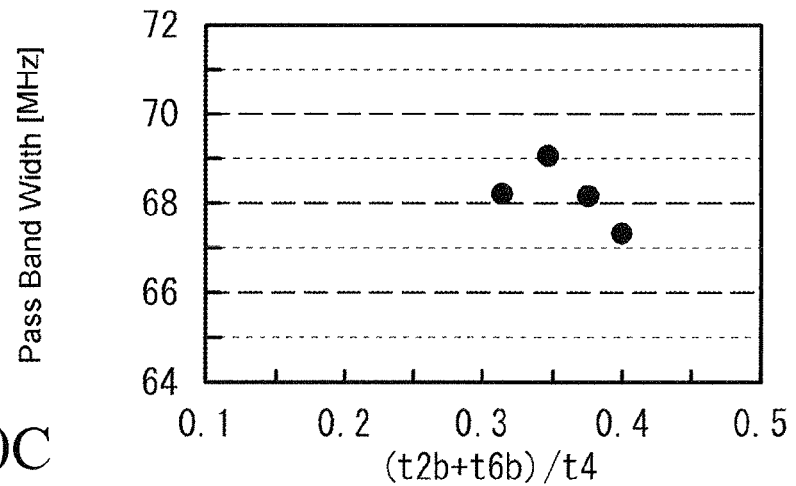
FIG. 10B illustrates pass-band widths with a loss of −1.8 dB for the respective film thickness ratios.
Figure 10C:
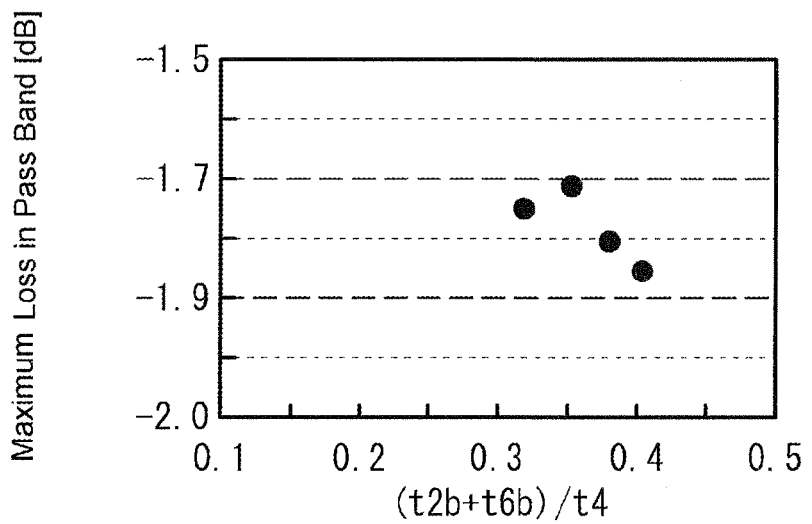
FIG. 10C illustrates the maximum insertion losses in the pass band for the respective film thickness ratios.

A description will now be given of sample filters. FIG. 10A illustrates the pass-band characteristic of a filter that is configured as illustrated in FIG. 5 and is equipped with the reference resonator (which has a film thickness ratio of 0.4) and the pass-band characteristics of filters that are configured as illustrated in FIG. 5 and are respectively equipped with the resonators having film thickness ratios of the first embodiment. The first adjustment film 24 is 50 nm thick, and the second adjustment film 28 is 125 nm thick. FIG. 10B illustrates the pass-band widths of the filters that are respectively equipped with the resonators having the respective different film thickness ratios with an insertion loss of −1.8 dB. FIG. 10C illustrates the maximum loss in the pass bands of the filters that are respectively equipped with the resonators having the respective different film thickness ratios. For a film thickness ratio of about 0.35, the greatest pass-band width and the smallest loss in the pass band are obtained.

Figure 11A:
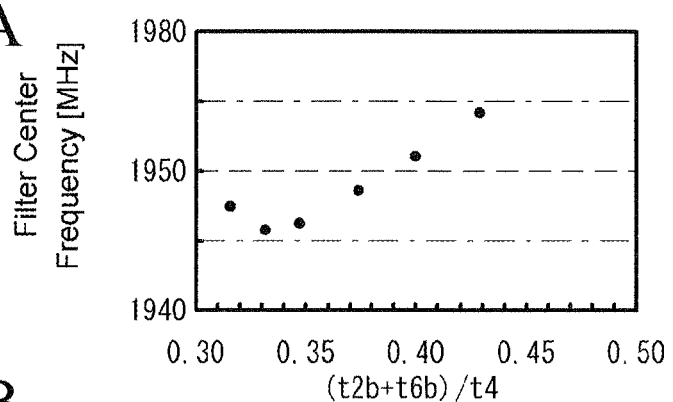
FIG. 11A illustrates the center frequencies of the filters having the respective different film thickness ratios of the first comparative example.
Figure 11B:
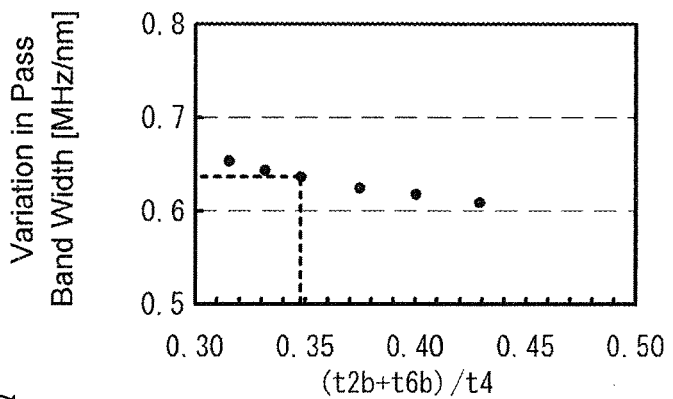
FIG. 11B illustrates a variation in the pass-band width per film thickness of 1 nm of the second adjustment film in the filters having the respective different film thickness radios of the first comparative example.
Figure 11C:
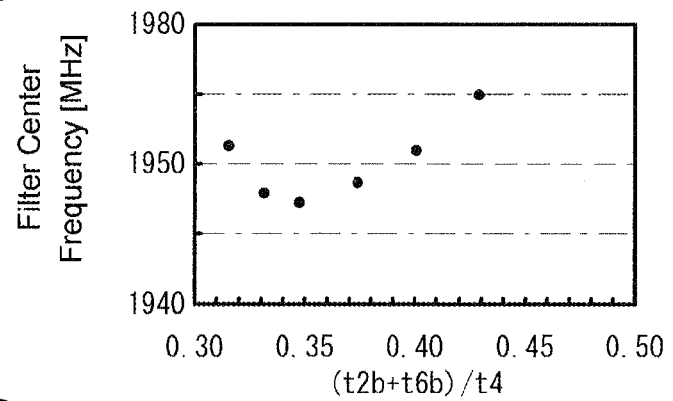
FIG. 11C illustrates the center frequencies of the filters having the respective different film thickness ratios of the first embodiment.
Figure 11D:
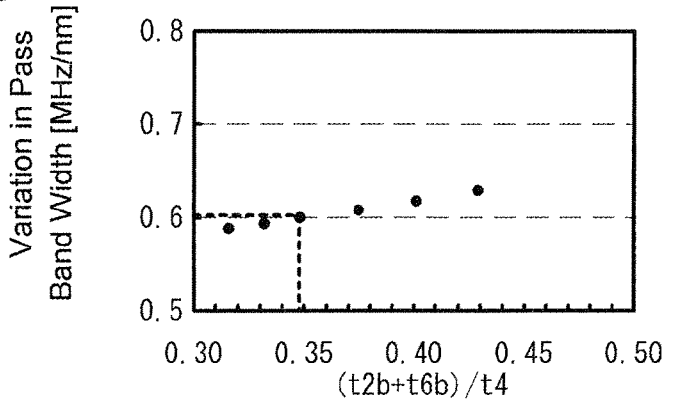
FIG. 11D illustrates a variation in the pass-band width per film thickness of 1 nm of a second adjustment film in the filters having the respective different film thickness radios of the first embodiment.

A description will now be given of a simulation of frequency variations of the filters having the different film thickness ratios using a Mason's equivalent circuit. FIG. 11A illustrates the center frequencies of the filters having the respective different film thickness ratios of the first comparative example, and FIG. 11B illustrates a variation in the pass-band width per film thickness of 1 nm of the second adjustment film 28 in the filters having the respective different film thickness radios of the first comparative example. FIG. 11C illustrates the center frequencies of the filters having the respective different film thickness ratios of the first embodiment, and FIG. 11D illustrates a variation in the pass-band width per film thickness of 1 nm of the second adjustment film 28 in the filters having the respective different film thickness radios of the first embodiment.

As illustrated in FIGS. 11A and 11C, the first comparative example and the first embodiment have the lowest center frequencies for a film thickness ratio of about 0.35. It is possible to suppress frequency variations as long as the film thickness ratio is equal to or nearly equal to 0.35 even if there is an error in the film thickness. Referring to FIGS. 11B and 11D, when the film thickness is equal to or nearly equal to 0.35, the first embodiment has smaller variation in the pass-band width per 1 nm of the film thickness of the second adjustment film 28 than the first comparative example. The first embodiment has only a small variation in the pass-band width even if there is a variation in the thickness of the second adjustment film 28.

As described above, the filter equipped with the resonators of the first embodiment is capable of suppressing variation in the center frequency of the filter caused by variation in the film thickness ratio and suppressing variation in the pass-band width caused by variation in the thickness of the second adjustment film 28.

Preferably, the ratio of the mass of the lower electrode 12 and that of the upper electrode 16 falls within a certain range, which may be defined by simulation. In FIGS. 12A through 12F and FIGS. 13A through 13E, solid circles denote the center frequency vs. mass ratio (upper electrode 16/lower electrode 12) for film thickness ratios of 0.315, 0.33, 0.35, 0.375, 0.40 and 0.43. Particularly, the center frequencies for a film thickness ratio of 0.35 are denoted by double circles. In FIGS. 12A through 12F and FIGS. 13A through 13E, the total thickness of the low specific gravity lower electrode 12a and the low specific gravity upper electrode 16a, namely, t2a+t6a is set equal to 130 nm, and t2a is set equal to 75 nm-125 nm.

Referring to FIGS. 12A through 12F and FIGS. 13A through 13E, when the mass ratio is approximately equal to 1, the center frequency becomes the lowest. When the center frequency is equal to the minimum or close thereto, variation in the center frequency due to variation in the mass ratio is minimized. As illustrated in FIGS. 10A through 10C, most preferably, the film thickness ratio is equal to 0.35 in terms of the pass-band width and the maximum insertion loss. It can be seen from FIGS. 11C and 11D that variation in the center frequency due to variation in the film thickness ratio is minimized for a film thickness ratio of 0.35. Since the center frequency with regard to the mass ratio is the lowest for a film thickness ratio of 0.35, variation in the center frequency caused by variations in the mass ratio and the film thickness ratio is minimized, and the greatest improvements in the pass-band width and the maximum insertion loss are obtained.

Figure 12A:
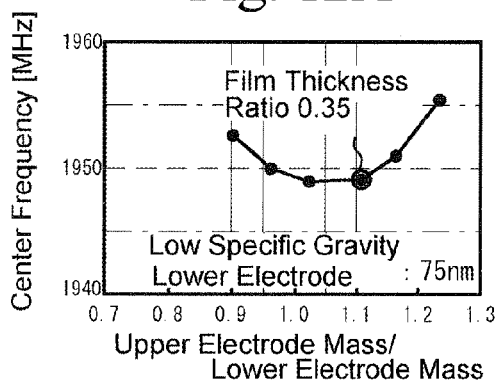
FIGS. 12A through 12F illustrate a center frequency vs. the mass ratio for each film thickness ratio (part 1)
Figure 12D:
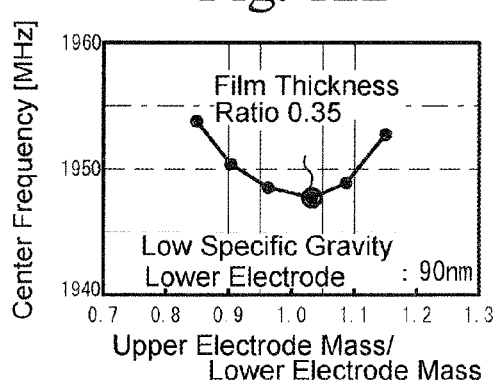
Figure 12B:
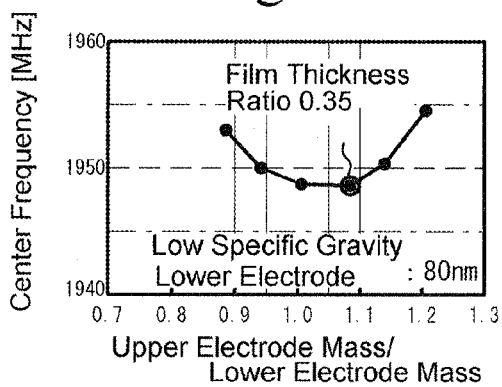
Figure 12E:
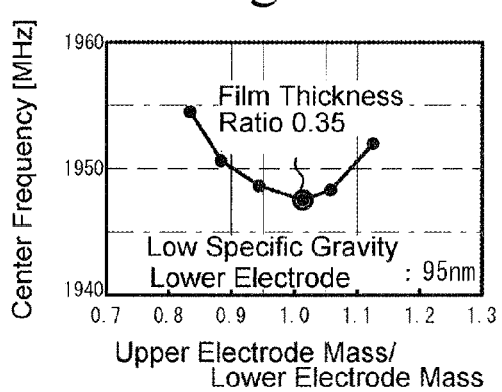
Figure 12C:
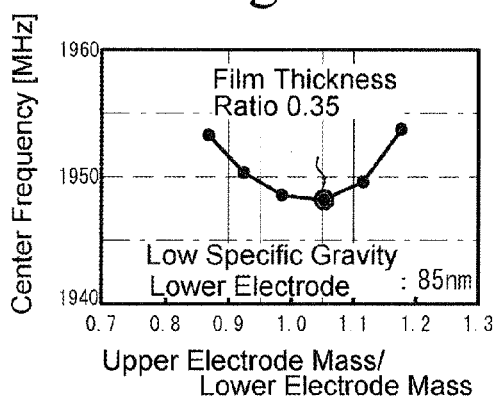
Figure 12F:
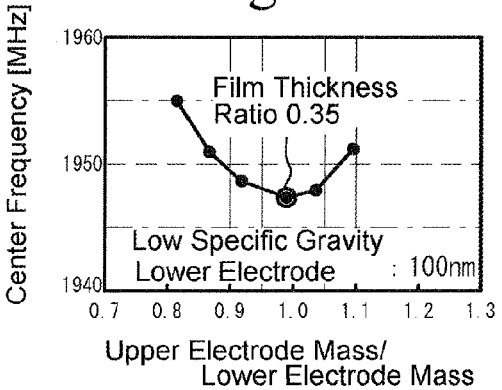
Figure 13A:
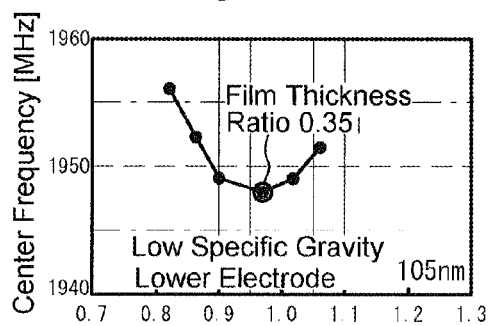
FIGS. 13A through 13E illustrate a center frequency vs. the mass ratio for each film thickness ratio (part 2)
Figure 13D:
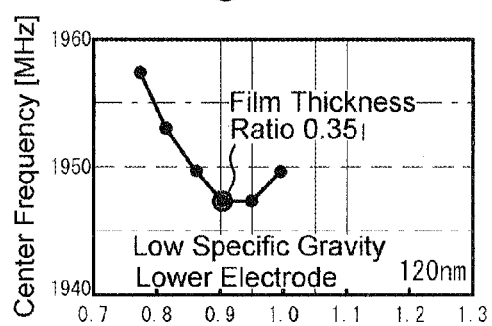
Figure 13B:
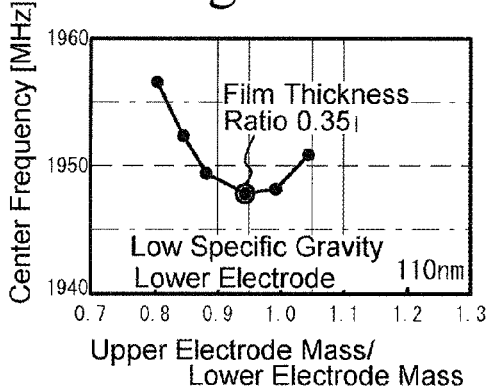
Figure 13E:
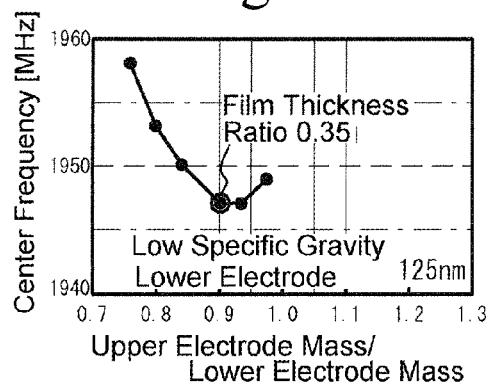
Figure 13C:
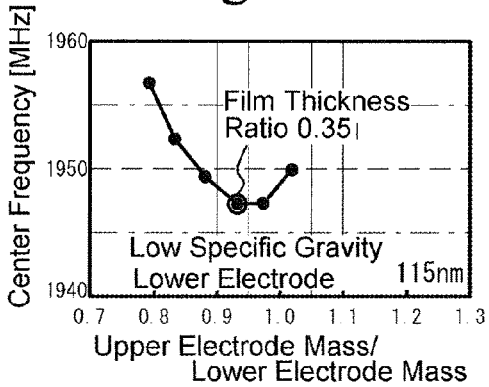

The frequency for a film thickness ratio of 0.35 is the lowest in cases between FIG. 12B and FIG. 13C. The tolerable range in which the lower electrode 12 and the upper electrode 16 deem to have an equal mass is 10% or less. Further, in cases between FIG. 12C and FIG. 13B, the tolerable range in which the lower electrode 12 and the upper electrode 16 deem to have an equal mass is 5% or less.

The above-described first embodiment is configured to have the electrodes 12a and 16a made of Cr and the electrodes 12b and 16b made of Ru. However, the materials of the electrodes are not limited to the above. It is enough for the lower electrode 12b to have a specific gravity greater than the lower electrode 12a and is enough for the upper electrode 16b to have a specific gravity greater than the upper electrode 16a. Preferably, the low specific gravity lower electrode 12a and the low specific gravity upper electrode 16a have an identical specific gravity, and the high specific gravity lower electrode 12b and the high specific gravity upper electrode 16b have an identical specific gravity. The aforementioned materials may be used to form the electrodes 12a, 12b, 16a and 16b. For instance, the high specific gravity lower electrode 12b and the high specific gravity upper electrode 16b may be made of at least one of W, Pt, Mo and Ir, which materials have a relatively high specific gravities.

The piezoelectric film 14 may be made of AlN or ZnO having an orientation having the main axis in the (002) direction. It is thus possible to obtain the thin film of high quality and realize the reliable resonance performance.

Preferably, the shape of the resonance section 40 projected onto the substrate 10 has an ellipse. That is, it is preferable that at least one of the lower electrode 12 and the upper electrode 16 has an elliptic shape. It is thus possible to suppress unwanted spurious resonances. The substrate 10 may be a glass substrate or a quartz substrate other than the silicon substrate.

The cavity 20 may be formed between the substrate 10 and the lower electrode 12. The cavity 20 may be a via that pierces the substrate 10, as illustrated in FIG. 1. That is, the via is located below the lower electrode 12 so that the resonance section 40 is included in the via and the lower electrode is exposed through the via. The first embodiment includes not only the FBAR type but also the SMR type as illustrated in FIG. 4 in which the acoustic multilayer film 22 is used instead of the cavity 20.

Second Embodiment

Figure 14:
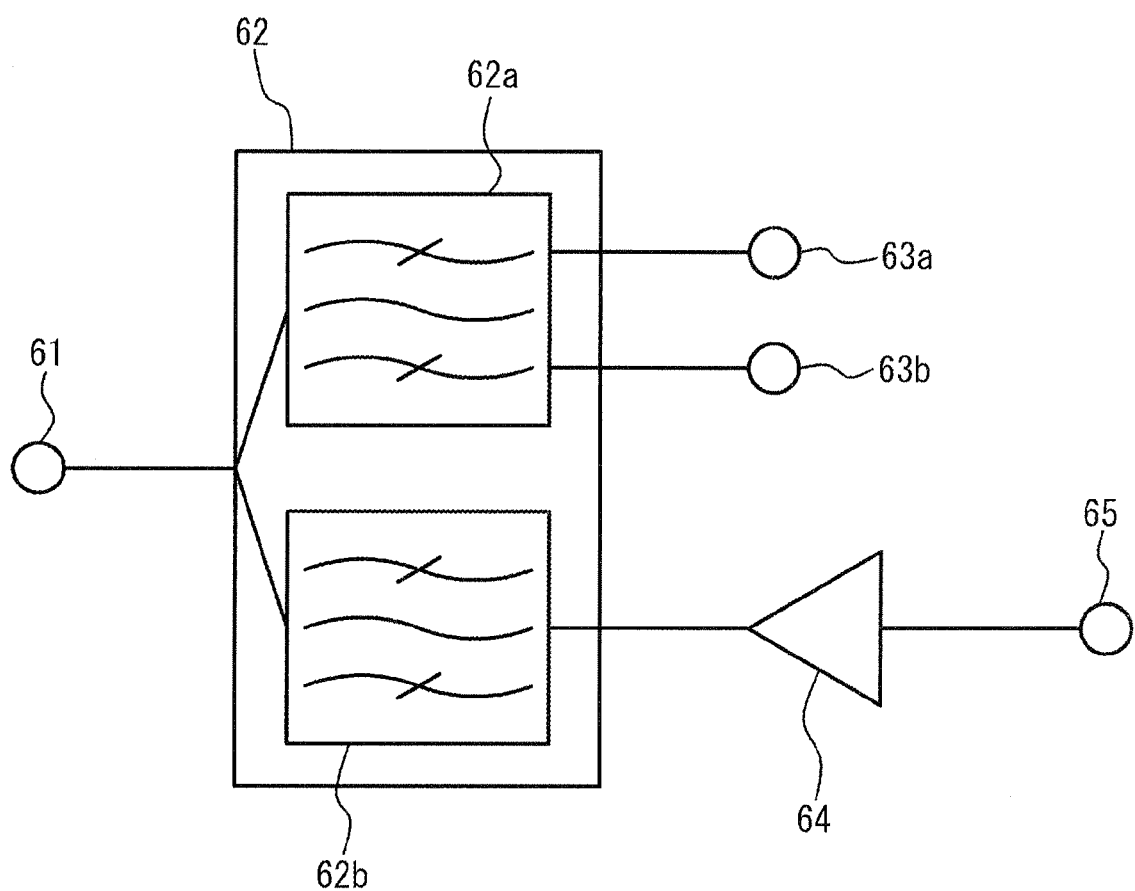
FIG. 14 is a block diagram of a duplexer in accordance with a second embodiment.

A second embodiment is an exemplary duplexer using the resonators of the first embodiment. FIG. 14 is a block diagram of a duplexer in accordance with the second embodiment. A duplexer 62 is equipped with a reception filter 62a and a transmission filter 62b. The reception filter 62a and the transmission filter 62b are connected to a common terminal or antenna terminal 61. The reception filter 62a is connected to two reception terminals 63a and 63b, which are balanced output terminals. The transmission filter 62b is connected to a transmission terminal 65 via a power amplifier 64. A phase shifter for impedance matching may be provided between the common terminal 61 and at least one of the reception filter 62a and the transmission filter 62b.

The reception filter 62a of the duplexer 62 may be a bandpass filter and allows signal components at reception frequencies to pass therethrough. The received signal via the common terminal 61 passes through the reception filter 62a and is output via the reception terminals 63a and 63b in the balanced formation. The transmission filter 62b suppresses the received signal to prevent the received signal to be output to the transmission terminal 65. The transmission filter 62b of the duplexer 62 is a bandpass filter and allows signal components at transmission frequencies to pass therethrough. The transmission signal applied via the transmission terminal 65 and amplified by the power amplifier 64 passes through the transmission filter 62b and is applied to the common terminal 61. The reception filter 62a suppresses the frequencies of the transmission signal, so that the transmission signal cannot be output to the reception terminals 63a and 63b.

In the second embodiment, at least one of the reception filter 62a and the transmission filter 62b is formed by the resonators of the first embodiment. It is thus possible to improve the electromechanical coupling coefficient of the resonators and to thus improve the filter characteristic. The filter thus configured has only a small frequency variation for variations in the film thickness ratio and the thickness of the second adjustment film. It is thus possible to improve the characteristic of the duplexer. The duplexer may be configured to have a reception terminal of unbalanced type and may have another configuration.

Third Embodiment

Figure 15:
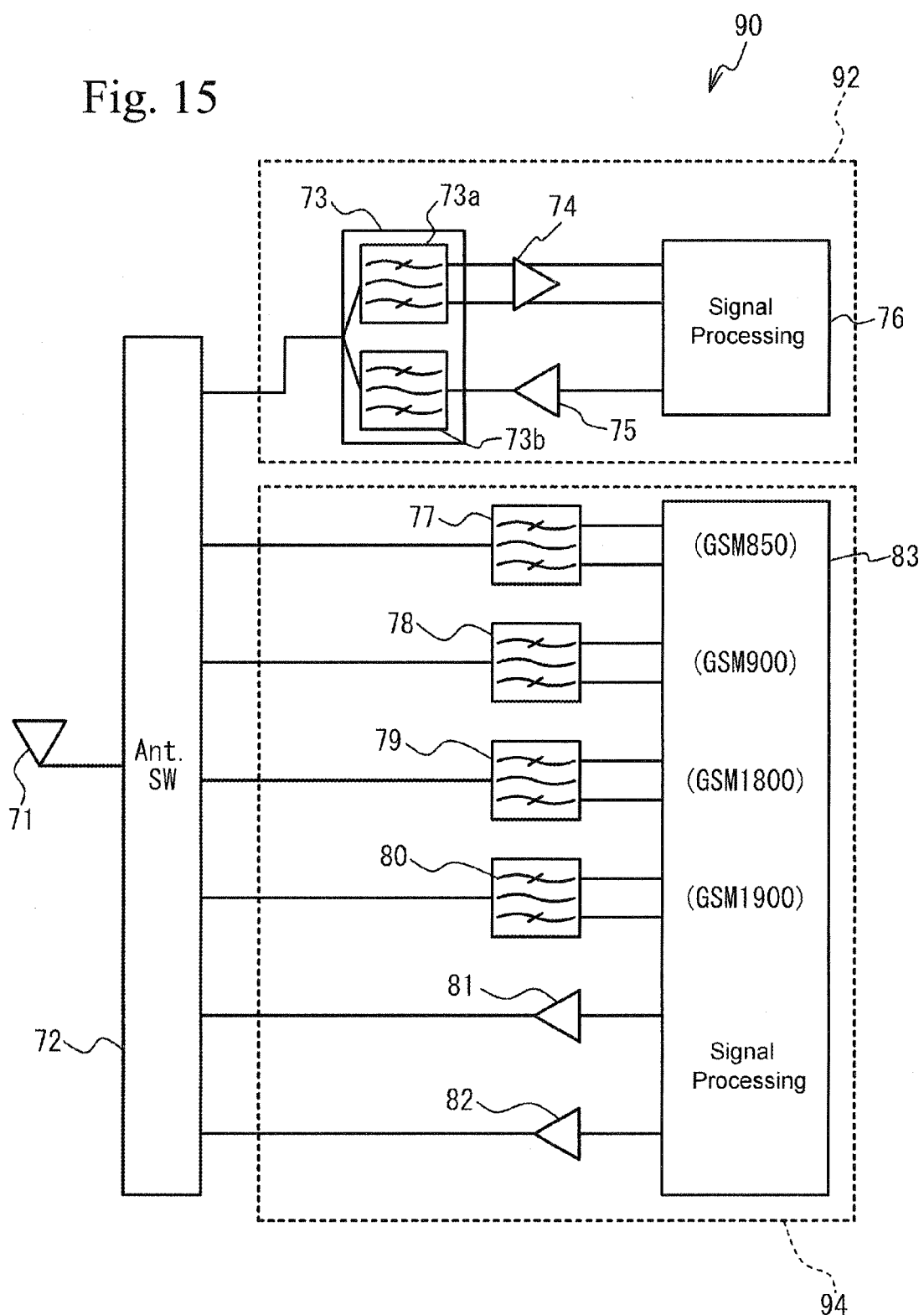
FIG. 15 is a block diagram of a portable phone in accordance with a third embodiment.

A third embodiment is a portable phone, which is an example of the electronic device equipped with the resonators of the first embodiment. FIG. 15 is a block diagram of an RF (Radio Frequency) section of a portable phone 90 in accordance with the third embodiment. The portable phone 90 is capable of handing both GSM (Global System for Mobile Communication) and W-CDMA (wideband Code Division Multiple Access). In GSM, the portable phone 90 can operate in the 850 MHz band (GSM850), 900 MHz band (GSM900), 1800 MHz band (GSM1800) and 1900 MHz (GSM1900). An antenna 71 has a capability of receiving and transmitting signals in both GSM and W-CDMA. An antenna switch (Ant. SW) 72 selects a W-CDMA section 92 when signals in W-CDMA are received or transmitted, so that the antenna 71 can be connected to the W-CDMA section 92. When signals in GSM, the antenna switch 72 selects a GSM section 94 for making a connection between the antenna 71 and the GSM section 94.

The W-CDMA section 92 is composed of a duplexer 73, a low-noise amplifier 74, a power amplifier 75 and a signal processing part 76. The signal processing part 76 produces a W-CDMA transmission signal. The power amplifier 75 amplifiers the W-CDMA transmission signal. A transmission filter 73b of the duplexer 73 passes the transmission signal and applies it to the antenna switch 72. A reception filter 73a of the duplexer 73 passes a W-CDMA reception signal received via the antenna switch 72 and outputs it to the low-noise amplifier 74. The low-noise amplifier 74 amplifies the W-CDMA reception signal. The signal processing part 76 down-converts the reception signal, and outputs a resultant signal to a processing part of a next stage.

The GSM section 94 is equipped with filters 77 through 80, power amplifiers 81 and 82, and a signal processing part 83. The signal processing part 83 produces a GSM transmission signal. The power amplifier 81 amplifies the signals of GSM850 and GSM900, and the power amplifier 82 amplifies the signals of GSM1800 and GSM1900. The antenna switch 72 selects one of the filters 77 through 80 in accordance with the type of the GSM signal received via the antenna 71. The filters 77 through 80 filter the reception signals and output the filtered signals to the signal processing part 83. The signal processing part 83 down-converts the received signals, and outputs a resultant signal to a processing part of a next stage.

In the third embodiment, at least one of the filters 73a, 73b and 77 through 80 is formed by the resonators of the first embodiment. It is thus possible to provide the electronic device having improved filter characteristics.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A resonator comprising:
   a substrate;
   a lower electrode;
   a piezoelectric film provided on the lower electrode; and
   an upper electrode provided on the piezoelectric film,
   the lower electrode including a first film provided on the substrate, and a second film that is provided on the first film and has a specific gravity greater than that of the first film, the piezoelectric film being provided on the second film, the upper electrode including a third film provided on the piezoelectric film, and a fourth film provided on the third film, the third film having a specific gravity greater than that of the fourth film, the third film being thicker than the second film, and a film that is provided between the third film and the fourth film.

2. The resonator according to claim 1, wherein the lower electrode and the upper electrode have an equal mass within a tolerable range of 10%.

3. The resonator according to claim 1, wherein the first film and the fourth film have an equal specific gravity, and the second film and the third film have an equal specific gravity.

4. The resonator according to claim 1, wherein the first film and the fourth film are made of Cr, and the second film and the third film are made of Ru.

5. The resonator according to claim 1, wherein the second film and the third film are made of at least one of Ru, W, Pt, Mo and Ir.

6. The resonator according to claim 1, wherein the piezoelectric film comprises AN or ZnO having an orientation having a main axis in a (002) direction.

7. The resonator according to claim 1, wherein at least one of the lower electrode and the upper electrode has an elliptic shape.

8. The resonator according to claim 1, wherein there is provided an opening below the lower electrode in a region in which the upper electrode and the lower electrode overlap each other across the piezoelectric film.

9. The resonator according to claim 1, wherein the lower electrode is curved so as to define a dome-shaped cavity between the substrate and the lower electrode.

10. A filter comprising resonators, each of the resonators including:

a substrate;

a lower electrode;

a piezoelectric film provided on the lower electrode; and an upper electrode provided on the piezoelectric film the lower electrode including a first film provided on the substrate, and a second film that is provided on the first film and has a specific gravity greater than that of the first film, the piezoelectric film being provided on the second film, the upper electrode including a third film provided on the piezoelectric film, and a fourth film provided on the third film, the third film having a specific gravity greater than that of the fourth film, and the third film being thicker than the second film, wherein the resonators include series-arm resonators and parallel-arm resonators, and the parallel-arm resonators include a film provided between the third film and the fourth film.

11. A duplexer, wherein the filter comprising the resonators according to claim 10 is arranged in at least one of a transmission system of the duplexer and a reception system of the duplexer.

12. An electronic device comprising:

an antenna; and a filter connected to the antenna, the filter including resonators, each of which includes:

a substrate;

a lower electrode;

a piezoelectric film provided on the lower electrode; and an upper electrode provided on the piezoelectric film, the lower electrode including a first film provided on the substrate, and a second film that is provided on the first film and has a specific gravity greater than that of the first film, the piezoelectric film being provided on the second film, the upper electrode including a third film provided on the piezoelectric film, and a fourth film provided on the third film, the third film having a specific gravity greater than that of the fourth film, and the third film being thicker than the second film, wherein the resonators include series-arm resonators and parallel-arm resonators, and the parallel-arm resonators include a film provided between the third film and the fourth film.

\* \* \* \* \*